United States Patent
Wang et al.

(10) Patent No.: US 8,747,629 B2
(45) Date of Patent: Jun. 10, 2014

(54) TMR DEVICE WITH NOVEL FREE LAYER

(75) Inventors: Hui-Chuan Wang, Pleasanton, CA (US); Tong Zhao, Fremont, CA (US); Min Li, Dublin, CA (US); Kunliang Zhang, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 743 days.

(21) Appl. No.: 12/284,454

(22) Filed: Sep. 22, 2008

(65) Prior Publication Data
US 2010/0073828 A1 Mar. 25, 2010

(51) Int. Cl.
C23C 14/00 (2006.01)
C23C 14/32 (2006.01)
G11B 5/33 (2006.01)
G11B 5/127 (2006.01)

(52) U.S. Cl.
USPC .................................. 204/192.2; 360/324.12

(58) Field of Classification Search
USPC .......... 204/192.1; 306/324.2; 428/811–811.3; 360/324.2
See application file for complete search history.

(56) References Cited

U.S. PATENT DOCUMENTS

| 6,841,395 | B2 | 1/2005 | Linn et al. | |
|---|---|---|---|---|
| 2002/0048127 | A1* | 4/2002 | Fukuzawa et al. | 360/324.1 |
| 2003/0062975 | A1* | 4/2003 | Kishi et al. | 335/106 |
| 2003/0123198 | A1 | 7/2003 | Sugawara et al. | |
| 2004/0136232 | A1 | 7/2004 | Hosomi et al. | |
| 2005/0052793 | A1* | 3/2005 | Hong et al. | 360/324.12 |
| 2005/0243479 | A1* | 11/2005 | Gill | 360/324.12 |
| 2006/0081952 | A1* | 4/2006 | Lin | 257/421 |
| 2007/0047159 | A1* | 3/2007 | Zhao et al. | 360/324.12 |
| 2007/0070553 | A1* | 3/2007 | Tsunekawa et al. | 360/313 |
| 2007/0111332 | A1 | 5/2007 | Zhao et al. | |
| 2007/0297090 | A1* | 12/2007 | Gill | 360/123 |
| 2008/0299679 | A1* | 12/2008 | Zhao et al. | 438/3 |
| 2009/0122450 | A1* | 5/2009 | Wang et al. | 360/324.2 |
| 2009/0246557 | A1* | 10/2009 | Horng et al. | 428/811.1 |
| 2010/0073827 | A1* | 3/2010 | Zhao et al. | 360/324.2 |

FOREIGN PATENT DOCUMENTS

KR 2006084235 A * 7/2006

OTHER PUBLICATIONS

"Ultralow resistance-area product of 0.4(um)sq. and high magnetoresistance above 50% in CoFeB/MgO/CoFeB magnetic tunnel junctions," by Nagamine et al., Applied Physics Letters, vol. 89, (2006), 162507 1-3.

(Continued)

*Primary Examiner* — Roy King
*Assistant Examiner* — Jenny Wu
(74) *Attorney, Agent, or Firm* — Saile Ackerman LLC; Stephen B. Ackerman

(57) ABSTRACT

A TMR sensor with a free layer having a FL1/FL2/FL3 configuration is disclosed in which FL1 is FeCo or a FeCo alloy with a thickness between 2 and 15 Angstroms. The FL2 layer is made of CoFeB or a CoFeB alloy having a thickness from 2 to 10 Angstroms. The FL3 layer is from 10 to 100 Angstroms thick and has a negative λ to offset the positive λ from FL1 and FL2 layers and is comprised of CoB or a CoBQ alloy where Q is one of Ni, Mn, Tb, W, Hf, Zr, Nb, and Si. Alternatively, the FL3 layer may be a composite such as CoB/CoFe, $(CoB/CoFe)_n$ where n is ≥2 or $(CoB/CoFe)_m/CoB$ where m is ≥1. The free layer described herein affords a high TMR ratio above 60% while achieving low values for λ ($<5 \times 10^{-6}$), RA (1.5 ohm/μm²), and Hc (<6 Oe).

6 Claims, 3 Drawing Sheets

(56) References Cited

OTHER PUBLICATIONS

"Giant tunneling magnetoresistance effect in low-resistance CoFeB/MgO (001)/CoFeB magnetic tunnel junctions for read-head applications," by Tsunekawa et al., Applied Physics Letters, vol. 87, (2005), pp. 072503 1-3.

"Giant tunneling magnetoresistance up to 410% at room temperature in fully epitaxial Co/MgO/Co magnetic tunnel junctions with bcc Co(001) electrodes," by Yuasa et al., Applied Physics Letters, vol. 89, (2006), pp. 042505 1-3.

"230% room-temperature magnetoresistance in CoFeB/MgO/CoFeB magnetic tunnel junctions," by Djayaprawira et al., Applied Physics Letters, vol. 86, (2005), pp. 092502 1-3.

"Giant tunnelling magnetoresistance at room temperature with MgO(100) tunnel barriers," by Parkin et al., 2004 Nature Publishing Group, Published online: Oct. 31, 2004; doi: 10.1038/nmat1256, pp. 862-867. nature materials/vol. 3/Dec. 2004/www.nature.com/naturematerials.

"Giant room-temperature magnetoresistance in single-crystal Fe/MgO/Fe magnetic tunnel junctions," by Yuasa et al., 2004 Nature Publishing Group, Published online: Oct. 31, 2004; doi: 10.1038/nmat1257, pp. 868-871, nature materials/vol. 3/Dec. 2004/www.nature.com/naturematerials.

Co-pending U.S. Appl. No. 12/284,409, filed Sep. 22, 2008, "TMR Device with Novel Free Layer Structure," assigned to the same assignee as the present invention.

Co-pending U.S. Appl. No. 12/075,605, filed Mar. 12, 2008, "Two Step Annealing Process for TMR Device with Amorphous Free Layer," assigned to the same assignee as the present invention.

Japanese Office Action Patent Application No. 2009-218713 Mailed: Jan. 22, 2014.

* cited by examiner

TMR DEVICE WITH NOVEL FREE LAYER

RELATED PATENT APPLICATIONS

This application is related to the following: Ser. No. 11/983,329, filing date Nov. 8, 2007; Abandoned. Ser. No. 12/075,605, filing date Mar. 12, 2008; Pending; Ser. No. 12/284,409, filing date Sep. 22, 2008; pending; all assigned to a common assignee and herein incorporated by reference in their entirety.

FIELD OF THE INVENTION

The invention relates to a high performance tunneling magnetoresistive (TMR) sensor in a read head and a method for making the same, and in particular, to a composite free layer comprised of a CoFe or CoFe alloy layer formed on a tunnel barrier, a CoFeB or CoFeB alloy layer on the CoFe layer, and a CoB or CoB alloy or a multilayer structure comprised of CoB and CoFe as the top layer in the free layer stack to achieve high dR/R with low Hc, low magnetostriction, and low RA values.

BACKGROUND OF THE INVENTION

A TMR sensor otherwise known as a magnetic tunneling junction (MTJ) is a key component (memory element) in magnetic devices such as Magnetic Random Access Memory (MRAM) and a magnetic read head. A TMR sensor typically has a stack of layers with a configuration in which two ferromagnetic layers are separated by a thin non-magnetic insulator layer. The sensor stack in a so-called bottom spin valve configuration is generally comprised of a seed (buffer) layer, anti-ferromagnetic (AFM) layer, pinned layer, tunnel barrier layer, free layer, and capping layer that are sequentially formed on a substrate. The free layer serves as a sensing layer that responds to external fields (media field) while the pinned layer is relatively fixed and functions as a reference layer. The electrical resistance through the tunnel barrier layer (insulator layer) varies with the relative orientation of the free layer moment compared with the reference layer moment and thereby converts magnetic signals into electrical signals. In a magnetic read head, the TMR sensor is formed between a bottom shield and a top shield. When a sense current is passed from the top shield to the bottom shield (or top conductor to bottom conductor in a MRAM device) in a direction perpendicular to the planes of the TMR layers (CPP designation), a lower resistance is detected when the magnetization directions of the free and reference layers are in a parallel state ("1" memory state) and a higher resistance is noted when they are in an anti-parallel state or "0" memory state. Alternatively, a TMR sensor may be configured as a current in plane (CIP) structure which indicates the direction of the sense current.

A giant magnetoresistive (GMR) head is another type of memory device. In this design, the insulator layer between the pinned layer and free layer in the TMR stack is replaced by a non-magnetic conductive layer such as copper.

In the TMR stack, the pinned layer may have a synthetic anti-ferromagnetic (SyAF) configuration in which an outer pinned layer is magnetically coupled through a coupling layer to an inner pinned layer that contacts the tunnel barrier. The outer pinned layer has a magnetic moment that is fixed in a certain direction by exchange coupling with the adjacent AFM layer which is magnetized in the same direction. The tunnel barrier layer is so thin that a current through it can be established by quantum mechanical tunneling of conduction electrons.

A TMR sensor is currently the most promising candidate for replacing a GMR sensor in upcoming generations of magnetic recording heads. An advanced TMR sensor may have a cross-sectional area of about 0.1 microns×0.1 microns at the air bearing surface (ABS) plane of the read head. The advantage of a TMR sensor is that a substantially higher MR ratio can be realized than for a GMR sensor. In addition to a high MR ratio, a high performance TMR sensor requires a low areal resistance RA (area×resistance) value, a free layer with low magnetostriction ($\lambda$) and low coercivity (Hc), a strong pinned layer, and low interlayer coupling (Hin) through the barrier layer. The MR ratio (also referred to as TMR ratio) is dR/R where R is the minimum resistance of the TMR sensor and dR is the change in resistance observed by changing the magnetic state of the free layer. A higher dR/R improves the readout speed. For high recording density or high frequency applications, RA must be reduced to about 1 to 3 ohm-um$^2$.

A MgO based MTJ is a very promising candidate for high frequency recording applications because its tunneling magnetoresistive (TMR) ratio is significantly higher than for AlOx or TiOx based MTJs. S. Yuasa et al. in "Giant room-temperature magnetoresistance in single crystal Fe/MgO/Fe magnetic tunnel junctions", Nature Materials 3, 868-871 (2004) and S. Parkin et al. in "Giant tunneling magnetoresistance at room temperature with MgO (100) tunnel barriers", Nature Materials 3, 862-867 (2004) demonstrated that a MR ratio of ~200% can be achieved at room temperature in epitaxial Fe(001)/MgO(001)/Fe(001) and in polycrystalline FeCo(001)/MgO(001)/(Fe$_{70}$Co$_{30}$)$_{80}$B$_{20}$ MTJs. Yuasa et al. reported an MR ratio as high as 410% at RT in "Giant tunneling magnetoresistance up to 410% at room temperature in fully epitaxial Co/MgO/Co magnetic tunnel junctions with bcc Co(001) electrodes", Applied Physics Letters, 89, 042505 (2006). Meanwhile, D. Djayaprawira et. al showed that MTJs of CoFeB/MgO(001)/CoFeB structure made by conventional sputtering can also have a very high MR ratio of 230% with advantages of better flexibility and uniformity in "230% room temperature magnetoresistance in CoFeB/MgO/CoFeB magnetic tunnel junctions", Physics Letters 86, 092502 (2005). However, the aforementioned references have a higher than desired RA value.

For a low RA application, the MR ratio of CoFeB/Mg/MgO/CoFeB MTJs can reach 138% at RA=2.4 ohm/μm$^2$ according to K. Tsunekawa et al. in "Giant tunneling magnetoresistance effect in low resistance CoFeB/MgO(001)/CoFeB magnetic tunnel junctions for read head applications", Applied Physics Letters 87, 072503 (2005). In this case, a DC-sputtered Mg layer was inserted between the CoFeB pinned layer and an RF-sputtered MgO layer, an idea initially proposed by T. Linn et al. in U.S. Pat. No. 6,841,395 to prevent oxidation of the bottom electrode (CoFe) in a CoFe/MgO(reactive sputtering)/NiFe structure. Also, a Ta getter presputtering prior to RF sputtering a MgO layer can achieve 55% TMR with 0.4 ohm/μm$^2$ as reported by Y. Nagamine et al. in "Ultralow resistance-area product of 0.4 ohm/μm$^2$ and high magnetoresistance above 50% in CoFeB/MgO/CoFeB magnetic junctions", Applied Physics Letters, 89, 162507 (2006).

An alternative method of forming low RA in a MTJ with a MgO tunnel barrier is to DC sputter deposit a first Mg layer, perform a natural oxidation (NOX) process, and then DC sputter deposit a second Mg layer on the resulting MgO layer as described in related patent application Ser. No. 12/075,605. Benefits include better process control and improved MRR (read) uniformity.

In order to achieve a smaller Hc but still maintain a high TMR ratio, the industry tends to use CoFeB as the free layer in a TMR sensor based on a MgO tunnel barrier. Insertion of a thin CoFe layer between a MgO barrier and CoFeB free layer may be used for realizing a high MR ratio at a low annealing temperature below 300° C. However, there are two major concerns associated with a CoFeB free layer. One is a high positive magnetostriction (λ) and a second issue is a CoFeB free layer tends to cause excessive noise and lower the signal to noise ratio (SNR) which is undesirable. Furthermore, advanced technology requires an improved free layer in a TMR sensor with a TMR ratio above 60% and an RA of about 1.5 ohm/μm² or less in addition to a low value for magnetostriction, Hc, and noise level.

U.S. Patent Application Publication No. 2005/0052793 teaches a free layer with a trilayer configuration wherein each of the first, second, and third layers is selected from a group including Ni, Co, Fe, B, CoFe, CoFeB, NiFe, and alloys thereof.

U.S. Patent Application Publication No. 2003/0123198 discloses a free layer that may be made of CoFe, NiFe, CoFeB, or a lamination layer film thereof to realize a larger MR ratio and soft magnetic characteristics.

SUMMARY OF THE INVENTION

One objective of the present invention is to provide a TMR sensor with a free layer composition that increases dR/R above 60% while achieving a magnetostriction between $-5\times10^{-6}$ and $5\times10^{-6}$, a low RA value of about 1.5 ohm-μm², and a low coercivity in the range of 4 to 6 Oe.

Another objective of the present invention is to provide a sensor structure with a free layer according to the first embodiment that may be implemented in a GMR design.

A further objective of the present invention is to provide a method of forming a TMR sensor that satisfies the first objective and is cost effective.

According to one embodiment of the present invention, a TMR sensor is fabricated on a suitable substrate such as a bottom shield in a read head. The TMR sensor may have a bottom spin valve configuration comprised of a seed layer, AFM layer, pinned layer, tunnel barrier layer, free layer, and capping layer which are formed sequentially on the bottom shield. The tunnel barrier layer is preferably MgO formed by a process involving a natural oxidation of a DC sputter deposited Mg layer. Optional tunnel barrier materials are MgZnO, ZnO, $Al_2O_3$, TiOx, AlTiO, HfOx, ZrOx, or combinations thereof, or in combination with MgO. In one embodiment, the free layer is a composite comprised of a stack of three layers identified as FL1, FL2, FL3 which is formed in a configuration represented by tunnel barrier/FL1/FL2/FL3/capping layer.

The FL1 layer contacts the tunnel barrier layer and may be comprised of $Fe_{(100-X)}Co_X$ where x is from 0 to 100 atomic %, or a FeCoM alloy where M is one of Ni, Mn, Tb, W, Hf, Zr, Nb, Si, or B. When M is B, the boron content is preferably less than 5 atomic %. The FL1 layer provides high dR/R even at relatively low annealing temperatures (<300° C.) and has a thickness in the range of 2 to 15 Angstroms.

The FL2 layer has a thickness between 2 and 10 Angstroms and a configuration represented by $(Co_{100-V}Fe_V)_{100-Y}B_Y$ where v is 10 to 70 atomic %, and y is from 5 to 40 atomic %. Alternatively, the FL2 layer may be a CoFeBQ alloy where Q is one of Ni, Mn, Tb, W, Hf, Zr, Nb, or Si. The middle FL2 layer serves to increase dR/R when the annealing temperature is increased above 250° C. while still maintaining good magnetic softness. In one aspect, the FeCo portion of a FeCo/CoB free layer is separated into FL1 and FL2 sections comprised of FeCo or FeCoM and CoFeB or CoFeBQ, respectively. The FL2 section is responsible for increasing the TMR ratio while the FL1 thickness is reduced in order to realize low magnetostriction.

In one embodiment, the FL3 layer may be made of $CoB_Z$ where z is 10 to 40 atomic % or may have a CoBQ composition. The FL3 layer has a low or negative λ to offset a positive λ contribution from the FL1 and FL2 layers. In another embodiment, the FL3 layer may have a composite structure such as $(CoB/CoFe)_m$ or $(CoB/CoFe)_m/CoB$ where m is ≥1. Each of the CoB layers has a thickness from 10 to 100 Angstroms and each of the CoFe layers has a thickness between 2 and 10 Angstroms. Total free layer (FL1/FL2/FL3) thickness is preferably less than about 100 Angstroms.

In a FeCo/CoB free layer, Hc will undesirably increase as the annealing temperature is raised to produce a higher TMR ratio. According to the present invention, a thin CoFeB or CoFeBQ alloy is inserted between the FeCo and CoB layers to enable an enhanced TMR ratio at higher annealing temperatures while maintaining small Hc, low magnetostriction, and low RA values.

Typically, a TMR stack of layers is laid down in a sputtering system. All of the layers may be deposited in the same sputter chamber. Preferably, the MgO tunnel barrier is formed by depositing a first Mg layer on the pinned layer followed by a natural oxidation process on the first Mg layer to form a MgO layer and then depositing a second Mg layer on the MgO layer. The oxidation step is performed in an oxidation chamber within the sputtering system. The TMR stack is patterned by a conventional method prior to forming a top shield on the cap layer.

DETAILED DESCRIPTION OF THE INVENTION

The present invention is a composite free layer that is employed in a sensor element to provide enhanced TMR ratio with low values for RA, magnetostriction, and Hc necessary for high performance magnetic devices. While the exemplary embodiment depicts a TMR sensor in a read head, the present invention may be employed in other devices based on a magnetoresistive element containing a free layer such as CIP-GMR or CPP-GMR sensors. Although a bottom spin valve structure is described for a TMR sensor, the present invention also encompasses a top spin valve or multilayer spin valve configuration as appreciated by those skilled in the art. Drawings are provided by way of example and are not intended to limit the scope of the invention.

Previously, in related patent application Ser. No. 11/983,329, we disclosed a FeCo/CoB free layer for achieving low magnetostriction less than $5 \times 10^{-6}$, a small Hc of 3 to 6 Oe, an RA between 2 to 3 ohm/$\mu m^2$, and a TMR ratio of about 60%. Subsequently, in related patent application Ser. No. 12/075,605, a method was described for improving Hex in a MTJ based on a FeCo/CoB free layer and involves a two step annealing procedure. With a 250° C./280° C. double anneal process, TMR ratio was maintained at 60% while Hc and $\lambda$ were kept at $1 \times 10^{-6}$ and 4 Oe, respectively. Moreover, RA was lowered to about 1.8 ohm/$\mu m^2$. To achieve a TMR ratio above 60%, an anneal temperature above 250° C. is required. However, Hc will undesirably increase for a FeCo/CoB free layer as anneal temperature is raised because the amorphous CoB grain size will grow larger. Therefore, we were motivated to modify the free layer to take advantage of a higher anneal temperature and simultaneously realize a higher TMR ratio while keeping Hc, RA, and $\lambda$ at acceptable values.

It should be understood that in a CoFeB or CoB based free layer, a certain B content is needed to achieve the required magnetic softness. However, a large amount of non-magnetic B (typically 20 atomic %) that increases softness also tends to introduce extra noise and cause a degradation in the signal-to-noise ratio (SNR) in the read head. Higher B content also leads to high magnetostriction ($\lambda$) in the device which is a concern. Related patent application HT08-013 discloses a free layer comprised of one or more CoB or CoFeB layers which provides noise reduction (improved SNR) while realizing a high dR/R, low $\lambda$ value, low RA, and low coercivity.

Figure 1:
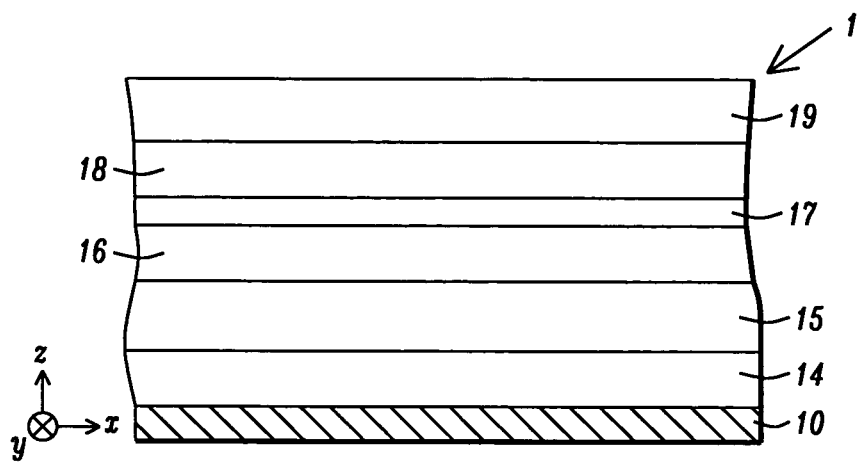
FIG. 1 is a cross-sectional view showing a TMR stack of layers according to one embodiment of the present invention.

According to the present invention, a CoFe/CoB free layer may be modified by including a third layer between the CoFe (FL1) and CoB (FL3) layers to give a FL1/FL2/FL3 configuration. Referring to FIG. 1, a portion of a partially formed TMR sensor 1 of the present invention is shown from the plane of an air bearing surface (ABS). There is a substrate 10 that in one embodiment is a bottom lead otherwise known as a bottom shield (S1) which may be a NiFe layer about 2 microns thick that is formed by a conventional method on a substructure (not shown). The substructure may be comprised of a wafer made of AlTiC, for example.

A TMR stack is formed on the substrate 10 and in the exemplary embodiment has a bottom spin valve configuration wherein a seed layer 14, AFM layer 15, pinned layer 16, tunnel barrier layer 17, free layer 18, and capping layer 19 are sequentially formed on the substrate. The seed layer 14 is preferably a Ta/Ru composite but Ta, Ta/NiCr, Ta/Cu, Ta/Cr or other seed layer configurations may be employed, instead. The seed layer 14 serves to promote a smooth and uniform grain structure in overlying layers. Above the seed layer 14 is an AFM layer 15 used to pin the magnetization direction of the overlying pinned layer 16, and in particular, the outer portion or AP2 layer (not shown). The AFM layer 15 has a thickness from 40 to 300 Angstroms and is preferably comprised of IrMn. Optionally, one of PtMn, NiMn, OsMn, RuMn, RhMn, PdMn, RuRhMn, or MnPtPd may be employed as the AFM layer.

The pinned layer 16 preferably has a synthetic anti-ferromagnetic (SyAF) configuration represented by AP2/Ru/AP1 where a coupling layer made of Ru, Rh, or Ir, for example, is sandwiched between an AP2 layer and an AP1 layer (not shown). The AP2 layer which is also referred to as the outer pinned layer contacts the AFM layer 15 and may be made of CoFe with a composition of about 10 atomic % Fe and with a thickness of about 10 to 50 Angstroms. The magnetic moment of the AP2 layer is pinned in a direction anti-parallel to the magnetic moment of the AP1 layer. For example, the AP2 layer may have a magnetic moment oriented along the "+x" direction while the AP1 layer has a magnetic moment in the "−x" direction. A slight difference in thickness between the AP2 and AP1 layers produces a small net magnetic moment for the pinned layer 16 along the easy axis direction of the TMR sensor to be patterned in a later step. Exchange coupling between the AP2 layer and the AP1 layer is facilitated by a coupling layer that is preferably comprised of Ru with a thickness from 3 to 9 Angstroms. The AP1 layer is also referred to as the inner pinned layer and may be a single layer or a composite layer. In one aspect, the AP1 layer is amorphous in order to provide a more uniform surface on which to form the tunnel barrier layer 17. The AP1 layer may be comprised of CoFeB, CoFe, or a composite thereof, and has an upper surface that contacts the tunnel barrier layer 17.

In the exemplary embodiment that features a bottom spin valve configuration, the tunnel barrier layer 17 is preferably comprised of MgO because a MgO tunnel barrier is known to provide a higher TMR ratio than a TMR stack made with an $Al_2O_3$ or TiOx tunnel barrier. However, the present invention anticipates that the TMR stack may have a tunnel barrier made of MgZnO, ZnO, $Al_2O_3$, TiOx, AlTiO, HfOx, ZrOx, or combinations of two or more of the aforementioned materials including MgO.

In an embodiment where the tunnel barrier layer 17 is made of MgO, a preferred process is to DC sputter deposit a first Mg layer having a thickness between 4 and 14 Angstroms on the pinned layer 16, and then oxidize the Mg layer with a natural oxidation (NOX) process before depositing a second Mg layer with a thickness of 2 to 8 Angstroms on the oxidized first Mg layer as described in related patent application Ser. No. 11/983,329. In one aspect, the tunnel barrier is considered as having a MgO/Mg configuration. The second Mg layer serves to protect the subsequently deposited free layer from oxidation. It is believed that excessive oxygen accumulates at the top surface of the MgO layer as a result of the NOX process and this oxygen can oxidize a free layer that is formed directly on the MgO portion of the tunnel barrier layer. Note that the RA and MR ratio for the TMR sensor may be adjusted by varying the thickness of the two Mg layers in tunnel barrier layer 17 and by varying the natural oxidation time and pressure. Longer oxidation time and/or higher oxygen pressure will form a thicker MgO layer and increase the RA value.

All layers in the TMR stack may be deposited in a DC sputtering chamber of a sputtering system such as an Anelva C-7100 sputter deposition system which includes ultra high vacuum DC magnetron sputter chambers with multiple targets and at least one oxidation chamber. Typically, the sputter deposition process involves an argon sputter gas and a base pressure between $5 \times 10^{-8}$ and $5 \times 10^{-9}$ torr. A lower pressure enables more uniform films to be deposited.

The NOX process may be performed in an oxidation chamber within the sputter deposition system by applying an oxygen pressure of 0.1 mTorr to 1 Torr for about 15 to 300 seconds. In the exemplary embodiment, no heating or cooling is applied to the oxidation chamber during the NOX process. Oxygen pressure between $10^{-6}$ and 1 Torr is preferred for an oxidation time mentioned above in order to achieve a RA in the range of 0.5 to 5 ohm-$um^2$. A mixture of $O_2$ with other inert gases such as Ar, Kr, or Xe may also be used for better control of the oxidation process. We have found that the final RA uniformity (1σ) of 0.6 um circular devices is more than 10% when a MgO tunnel barrier layer is rf-sputtered and less than 3% when the MgO tunnel barrier is formed by DC sputtering a Mg layer followed by a NOX process.

Figure 2:
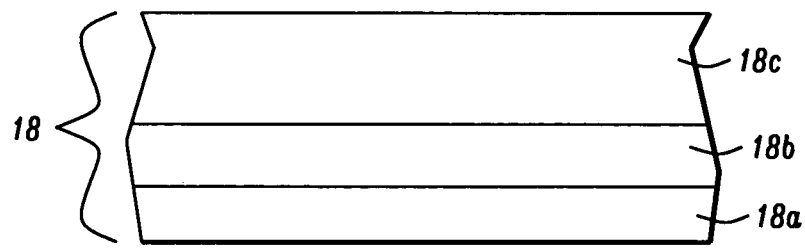
FIG. 2 is an enlarged drawing of the free layer in FIG. 1 that illustrates a trilayer configuration according to one embodiment of the present invention.

Returning to FIG. 1, an important feature of the present invention is the free layer 18 formed on the tunnel barrier layer 17. In a first embodiment illustrated in FIG. 2, the free layer 18 has a trilayer structure indicated by layers 18a-18c wherein the FL1, FL2, FL3 components of the FL1/FL2/FL3 trilayer are represented by layers 18a, 18b, and 18c, respectively. The FL1 layer 18a contacts the barrier layer 17 and may be comprised of $Fe_{(100-X)}Co_X$ where x is from 0 to 100 atomic %, or a FeCoM alloy where M is one of Ni, Mn, Tb, W, Hf, Zr, Nb, Si, or B. When M is B, the boron content is preferably less than 5 atomic %. For other M elements listed above, the M content in the alloy is preferably less than about 10 atomic %. The FL1 layer 18a has a thickness in the range of 2 to 15 Angstroms and promotes a high dR/R even at relatively low annealing temperatures (<300° C.) usually required in the read head fabrication process.

The FL2 layer 18b has a thickness between 2 and 10 Angstroms and a configuration represented by $(Co_{100-V}Fe_V)_{100-Y}B_Y$ where v is 10 to 70 atomic %, and y is from 5 to 40 atomic %. Alternatively, the FL2 layer may be a CoFeBQ alloy where Q is one of Ni, Mn, Tb, W, Hf, Zr, Nb, or Si. The middle FL2 layer 18b serves to increase dR/R when the annealing temperature is increased above 250° C. while still maintaining good magnetic softness. In one aspect, the FeCo portion of a FeCo/CoB free layer is replaced by a FL1/FL2 configuration where FL1 is a FeCo or FeCoM alloy and FL2 is a CoFeB or CoFeBQ alloy. The FL2 layer is responsible for increasing the TMR ratio while the FL1 thickness is reduced in order to realize low magnetostriction. In other words, FeCo in a FeCo/CoB free layer is partially replaced by a CoFeB or CoFeBQ alloy in the present invention in which the CoFeB or CoFeBQ material has a lower magnetostriction (λ) than FeCo. In another aspect, the M content in FeCoM alloys and the Q content in CoFeBQ alloys promotes magnetic softness and enables a higher annealing temperature to raise dR/R while maintaining low values for Hc, RA, and λ. The Q content in CoFeBQ alloys is preferably less than about 10 atomic %.

The FL3 layer 18c has a thickness between 10 and 100 Angstroms and may be made of $Co_{(100-Z)}B_Z$ where z is 10 to 40 atomic % or may have a CoBQ composition where Q is one of Ni, Mn, Tb, W, Hf, Zr, Nb, or Si. The FL3 layer has a low or negative λ to offset a positive λ contribution from the FL1 and FL2 layers. Total free layer 18 (FL1/FL2/FL3) thickness is preferably less than about 100 Angstroms.

Figure 3:
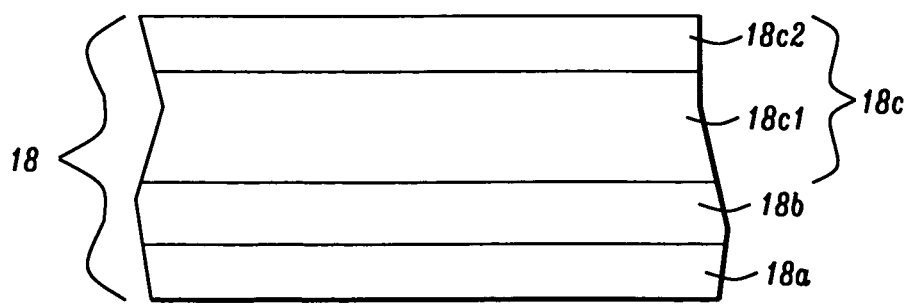
FIG. 3 is an enlargement of the free layer in FIG. 1 that shows a bilayer structure in the upper layer of the trilayer configuration according to a second embodiment of the present invention.

In an alternative embodiment shown in FIG. 3, the FL3 layer 18c is comprised of two layers 18c1 and 18c2 which are CoB and CoFe, respectively. The CoB layer 18c1 contacts the FL2 layer 18b and has a thickness from 10 to 100 Angstroms and the CoFe layer 18c2 has a thickness between 2 and 10 Angstroms. Optionally, layer 18c1 may be comprised of a CoBQ alloy and layer 18c2 may be made of a CoFeM alloy wherein the Q and M components are each less than about 10 atomic %.

Figure 4:
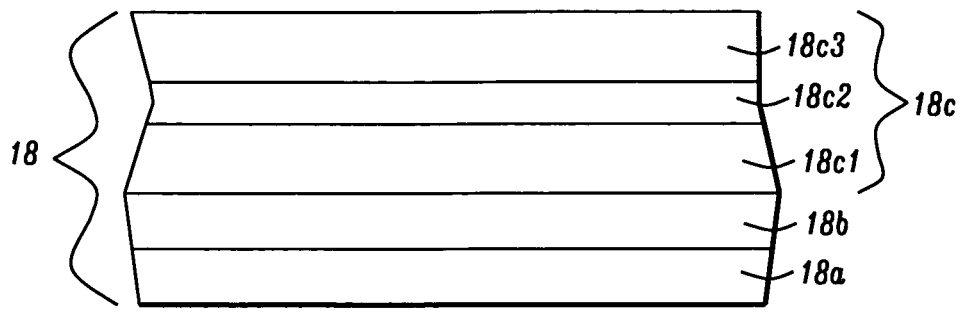
FIG. 4 is an enlargement of the free layer in FIG. 1 that depicts a trilayer structure in the upper layer of the trilayer configuration according to a third embodiment of the present invention.

In yet another embodiment depicted in FIG. 4, the FL3 layer 18c may have a configuration represented by CoB/CoFe/CoB in which a CoFe layer 18c2 is sandwiched between two CoB layers 18c1, 18c3. The combined thickness of the two CoB layers 18c1, 18c3 is from 10 to 100 Angstroms and the CoFe layer has a thickness between 2 and 10 Angstroms. Preferably, total thickness of the composite free layer 18 is kept below about 100 Angstroms.

Figure 5:
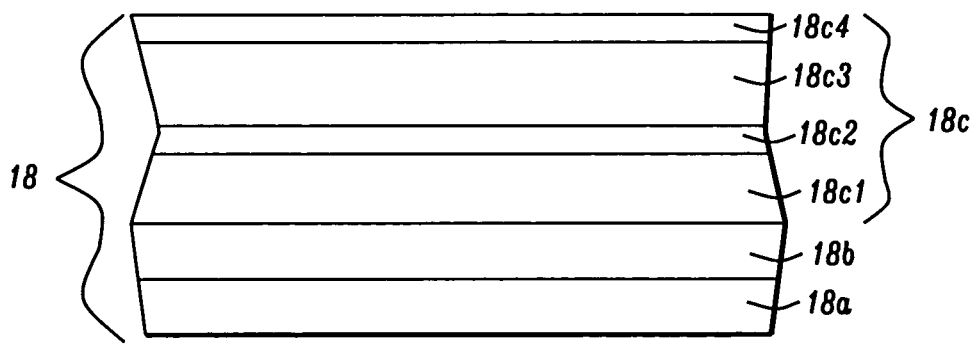
FIG. 5 is an enlargement of the free layer in FIG. 1 that shows a four layer structure in the upper layer of the trilayer configuration according to a fourth embodiment of the present invention.

An alternative embodiment is illustrated in FIG. 5 wherein the FL3 layer 18c is represented by CoB/CoFe/CoB/CoFe in which the CoB layers 18c1, 18c3 alternate with CoFe layers 18c2, 18c4 and the lower CoB layer 18c1 contacts the middle FL2 layer 18b. Each of the CoFe layers 18c2, 18c4 has a thickness from 2 to 10 Angstroms.

The present invention also encompasses additional embodiments (not shown) wherein the FL3 layer 18c is comprised of a composite structure such as $(CoB/CoFe)_n$ where n is >2 or $(CoB/CoFe)_m/CoB$ where m is >1. As in previous embodiments, one or more of the CoB layers may be replaced by a CoBQ alloy and one or more of the CoFe layers may be substituted by a CoFeM alloy. The combined thickness of the CoB or CoBQ layers is from 10 to 100 Angstroms and each of the CoFe or CoFeM layers has a thickness between 2 and 10 Angstroms for a total free layer 18 thickness of less than about 100 Angstroms.

After the free layer 18 is formed, a capping layer 19 is deposited on the free layer. Capping layer 19 may be comprised of Ru, Ta, or combinations thereof such as Ru/Ta/Ru. A Ru upper layer is typically preferred since Ru is resistant to oxidation, provides a good electrical connection to an overlying top lead (top shield) formed in a subsequent step, and serves as a CMP stop during a subsequent planarization process.

Once the TMR stack is complete, the partially formed read head 1 may be annealed in a vacuum oven within the range of 240° C. to 340° C., and preferably 250° C. to 270° C., with an applied magnetic field of at least 2000 Oe, and preferably between 8000 and 13000 Oe for about 2 to 5 hours to set the pinned layer and free layer magnetization directions. It should be understood that under certain conditions, depending upon the time and temperature involved in the anneal process, the tunnel barrier layer 17 may become a uniform MgO tunnel barrier layer as unreacted oxygen diffuses into the upper Mg layer in a MgO/Mg configuration. In another embodiment, a two step anneal process as described previously may be employed. A CoFeB or CoFeBQ alloy is partially crystalline in the range of 250° C. to about 300° C. Above 280° C. to 300° C., the CoFeB or CoFeBQ layer is entirely crystalline. On the other hand, a CoB or CoBQ alloy is believed to be mostly crystalline at 250° C. Generally, crystalline CoFeB (or CoFeBQ) layers afford a higher dR/R. However, Hc often becomes larger than desirable at elevated annealing temperatures which is why the preferred annealing temperature range according to the present invention is from 250° C. to 270° C. This temperature range represents a compromise condition for realizing both high dR/R above 60% and low Hc (<6 Oe).

Figure 6:
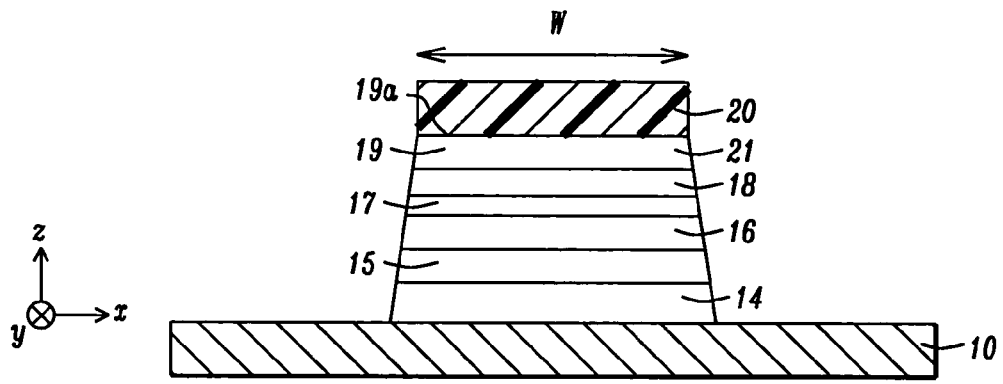
FIG. 6 is a cross-sectional view showing a TMR stack of layers that has been patterned to form a MTJ element during an intermediate step of fabricating the TMR sensor according to one embodiment of the present invention.

Referring to FIG. 6, the TMR stack is patterned by following a conventional process sequence. For example, a photoresist layer 20 may be coated on the capping layer 19. After the photoresist layer 20 is patterned, a reactive ion etch (RIE), ion beam etch (IBE), or the like is used to remove underlying layers in the TMR stack that are exposed by openings in the photoresist layer. The etch process stops on the bottom shield 10 or between the bottom shield and a barrier layer (not shown) to give a TMR sensor with a top surface 19a and sidewalls 21.

Figure 7:
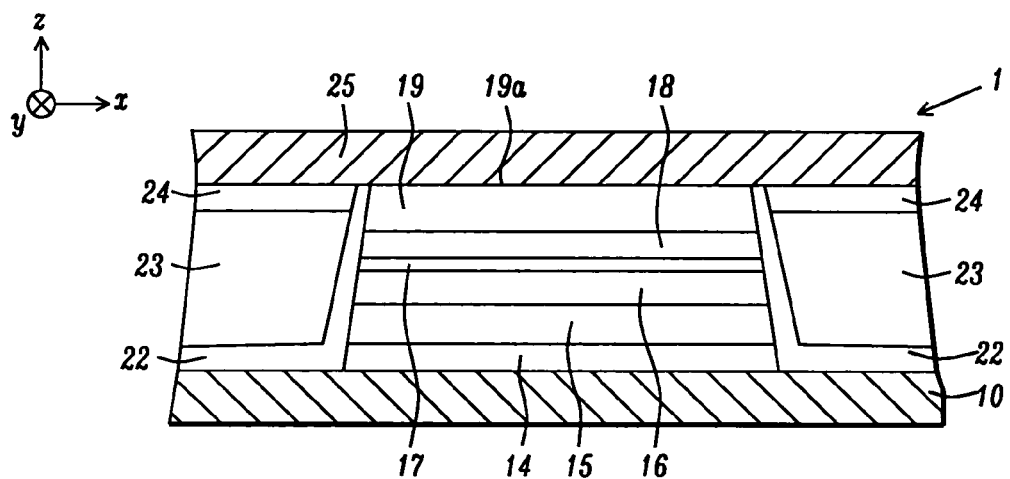
FIG. 7 is a cross-sectional view of a TMR read head having a MTJ element interposed between a top shield and bottom shield and formed according to an embodiment of the present invention.

Referring to FIG. 7, an insulating layer 22 may be deposited along the sidewalls 21 of the TMR sensor. The photoresist layer 20 is then removed by a lift off process. A top lead otherwise known as a top shield 25 is then deposited on the insulating layer 22 and top surface 19a of the TMR sensor. Similar to the bottom shield 10, the top shield 25 may also be a NiFe layer about 2 microns thick. The TMR read head 1 may be further comprised of a second gap layer (not shown) disposed on the top shield 25.

COMPARATIVE EXAMPLE

An experiment was conducted to demonstrate the improved performance achieved by implementing a free layer in a TMR sensor according to the present invention. Unpatterned TMR stacks of layers indicated as samples 1-3 in Table 1 were fabricated in a sputter deposition mainframe and analyzed by conventional methods to compare magnetic properties after an anneal process. Sample 3 was fabricated as a reference and is comprised of a prior art CoFe/CoB free layer wherein the lower $Co_{70}Fe_{30}$ layer is 5 Angstroms thick and the upper $Co_{80}B_{20}$ layer is 50 Angstroms thick. This free layer was disclosed in related patent application Ser. No. 11/983,329. All samples in the experiment have a seed/AFM/AP2/Ru/AP1/MgO/free layer/Ru configuration where AP2 and AP1 layers are comprised of CoFe, the seed layer is Ta/Ru, and the AFM layer is IrMn. The MgO tunnel barrier was formed by depositing a 7 Angstrom thick lower Mg layer that was subjected to a NOX process before a 4 Angstrom thick upper Mg layer was deposited. Sample 1 has the same free layer composition as the reference (Sample 3) but was annealed at 260° C. for 3 hours instead of 5 hours at 250° C. as in Sample 3. Sample 2 has a free layer according to one embodiment of the present invention and is represented by FeCo/CoFeB/CoB wherein the lower F1 layer (FeCo) is 4 Angstroms thick, the middle F2 layer (CoFeB) is 5 Angstroms thick, and the upper F3 layer (CoB) is 50 Angstroms thick. All samples were annealed with an applied magnetic field of 8000 Oe.

The thicknesses in Angstroms of the seed layer and AFM layer in the TMR stack are given in parentheses: Ta(20)/Ru(20) seed layer; and IrMn (70) AFM layer. The TMR stack was formed on a NiFe shield and was annealed at the indicated temperature with an applied field of 8000 Oe to achieve high dR/R while maintaining good magnetic softness.

TABLE 1

Magnetic properties of MgO based MTJs with free layers containing $Fe_{70}Co_{30}$ and $Co_{80}B_{20}$

| Sample | Free Layer Composition | Anneal | Hce | Lambda |
|---|---|---|---|---|
| 1 | FeCo5/CoB50 | 260 C., 3 hr. | 4.65 | $8.7 \times 10^{-7}$ |
| 2 | FeCo4/CoFeB5/CoB50 | 260 C., 3 hr. | 2.96 | $1.7 \times 10^{-6}$ |
| 3 | FeCo5/CoB50 | 250 C., 5 hr. | 4.01 | $7.5 \times 10^{-7}$ |

A comparison of Sample 1 to Sample 3 shows that Hce (coercivity in the easy axis direction) is increased as the FeCo/CoB annealing temperature is increased from 250° C. to 260° C. However, after reducing the FeCo thickness by 1 Angstrom and inserting a 5 Angstrom thick CoFeB layer between the FeCo and CoB layers (Sample 2), low Hc below 4 Oe and low $\lambda$ ($<3\times10^{-6}$) can be obtained even with the higher 260° C. annealing temperature. It is anticipated that an annealing temperature above 260° C. such as 270° C. will further increase dR/R while allowing Hce and $\lambda$ values to be maintained at acceptably low values of <6 Oe and $<5\times10^{-6}$, respectively.

In Table 2, results are shown after samples 2 and 3 were patterned to form 0.8 micron×0.8 micron TMR sensor elements on 6" device wafers. A higher TMR ratio was realized at the same low RA of 1.5 ohm/$\mu m^2$ for Sample 2 even with a higher anneal (260° C. vs 250° C. for Sample 3) because of the advantage of a FL1/FL2/FL3 free layer structure (FeCo/CoFeB/CoB) according to the present invention. A higher annealing temperature is compatible with Sample 2 which results in a dR/R greater than 60% to be achieved simultaneously with low values for RA, Hc, and $\lambda$. Thus, the TMR ratio can be improved over the prior art without a detrimental effect on other magnetic properties by employing a FL1/FL2/FL3 trilayer configuration described herein. We believe that dR/R values even greater than 60.5% can be achieved while maintaining reasonably low Hc, RA, and $\lambda$ values by optimizing the FL1/FL2/FL3 composition and thickness of the individual layers therein. Also, it is expected that dR/R will increase as device size is reduced below 0.8×0.8 microns. Furthermore, the trilayer concept according to the present invention is extendable to GMR devices where the tunnel barrier is replaced by a spacer layer such as Cu in GMR-CPP sensors, for example.

TABLE 2

Magnetic properties of MgO MTJs (6" device wafers)

| Sample | Free Layer Composition | Anneal | RA | Device dR/R |
|---|---|---|---|---|
| 2 | FeCo4/CoFeB5/CoB50 | 260 C., 3 hr. | 1.5 | 60.5% |
| 3 | FeCo5/CoB50 | 250 C., 5 hr. | 1.5 | 58.5% |

The free layers disclosed in the embodiments found herein may be fabricated without additional cost since no new sputtering targets or sputter chambers are required. Furthermore, a low temperature anneal process may be employed which is compatible with the processes for making GMR sensors. Therefore, there is no change in process flow and related processes compared with current manufacturing schemes.

While this invention has been particularly shown and described with reference to, the preferred embodiment thereof, it will be understood by those skilled in the art that various changes in form and details may be made without departing from the spirit and scope of this invention.

We claim:

1. A method of forming a sensor element in a magnetic device, comprising:
    (a) sequentially forming a stack of layers comprised of a seed layer, anti-ferromagnetic (AFM) layer, and a SyAP pinned layer having an AP2 layer/coupling layer/AP1 layer configuration on a substrate wherein the AP2 layer contacts said AFM layer;
    (b) forming a tunnel barrier having a first surface that contacts said AP1 layer and a second surface opposite the first surface;
    (c) forming a composite free layer having a FL1/FL2/FL3 configuration on the tunnel barrier, said composite free layer is comprised of:
        (1) a FL1 layer contacting the second surface of the tunnel barrier layer, said FL1 layer comprises $Fe_{(100-x)}Co_x$ where x is from 0 to 100 atomic %, or a FeCoM alloy where M is one of Ni, Mn, Tb, W, Hf, Zr, Nb, Si, or B;
        (2) a FL2 layer formed on the FL1 layer, said FL2 layer comprises $(Co_{100-v}Fe_v)_{100-y}B_y$ where v is 10 to 70 atomic %, and y is from 5 to 40 atomic %, or a CoFeB alloy; and
        (3) a FL3 layer disposed on the FL2 layer, said FL3 layer is a composite structure represented by $(CoB/CoFe)_n$ where n is $\geq 1$ or $(CoB/CoFe)_m/CoB$ where m is $\geq 1$.

2. The method of claim 1 wherein the FL3 layer has a CoB/CoFe/CoB/CoFe configuration, and each of said CoFe layers has a thickness between about 2 and 10 Angstroms.

3. The method of claim 1 wherein the FL3 layer comprises CoB and CoFe layers formed in an alternating fashion in a $(CoB/CoFe)_n$ structure where n is $\geq 1$ or in a $(CoB/CoFe)_m/CoB$ structure where m is $\geq 1$, and said CoB layers have a combined thickness from about 10 to 100 Angstroms, and each of said CoFe layers has a thickness between about 2 and 10 Angstroms.

4. The method of claim 1 wherein the FL1 layer has a thickness between about 2 and 15 Angstroms and the FL2 layer has a thickness between about 2 and 10 Angstroms.

5. The method of claim 1 further comprised of performing an anneal process comprising an applied magnetic field of about 8000 to 13000 Oe and a temperature between about 250° C. and 270° C. for a period of about 2 to 5 hours.

6. The method of claim 1 wherein the CoFeB alloy in the FL2 layer is represented by CoFeBQ where Q is one of Ni, Mn, Tb, W, Hf, Zr, Nb, and Si.

* * * * *